(12) United States Patent
Marshall et al.

(10) Patent No.: US 6,773,972 B2
(45) Date of Patent: Aug. 10, 2004

(54) MEMORY CELL WITH TRANSISTORS HAVING RELATIVELY HIGH THRESHOLD VOLTAGES IN RESPONSE TO SELECTIVE GATE DOPING

(75) Inventors: Andrew Marshall, Dallas, TX (US); Youngmin Kim, Allen, TX (US); David B Scott, Plano, TX (US); Douglas E. Mercer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 109 days.

(21) Appl. No.: 10/023,113

(22) Filed: Dec. 13, 2001

(65) Prior Publication Data

US 2002/0084493 A1 Jul. 4, 2002

Related U.S. Application Data

(60) Provisional application No. 60/259,324, filed on Jan. 3, 2001.

(51) Int. Cl.$^7$ .............................................. H01L 21/338
(52) U.S. Cl. ...................... 438/176; 438/181; 438/184; 438/217; 438/231; 438/276; 257/204; 257/288; 257/341; 257/371
(58) Field of Search ................................ 438/176, 181, 438/184, 217, 231, 276, 592, 296, 221; 257/204, 288, 341, 371, 369, 370

(56) References Cited

U.S. PATENT DOCUMENTS

2002/0137320 A1 * 9/2002 Nishihara et al.

* cited by examiner

Primary Examiner—W. David Coleman
Assistant Examiner—Khiem D Nguyen
(74) Attorney, Agent, or Firm—Peter K. McLarty; W. James Brady, III; Frederick J. Telecky, Jr.

(57) ABSTRACT

A method of forming a semiconductor circuit (20). The method forms a first transistor (NT1) using various steps, such as by forming a first source/drain region ($36_1$) as a first doped region in a fixed relationship to a semiconductor substrate (22) and forming a second source/drain region ($36_2$) as a second doped region in a fixed relationship to the semiconductor substrate. The second doped region and the first doped region are of a same conductivity type. Additionally, the first transistor is formed by forming a first gate ($28_3$) in a fixed relationship to the first source/drain region and the second drain region. The method also forms a second transistor (ST1) using various steps, such as by forming a third source/drain region ($34_1$) as a third doped region in a fixed relationship to the semiconductor substrate and forming a fourth source/drain region ($34_2$) as a fourth doped region in a fixed relationship to the semiconductor substrate. The fourth doped region and the third doped region are of the same conductivity type as the first and second doped regions. Additionally, the second transistor is formed by forming a second gate ($28_2$) in a fixed relationship to the third source/drain region and the fourth drain region. Also in the preferred embodiment method, the steps of forming the first gate and the second gate comprising forming the first gate to comprise a first dopant concentration and forming the second gate to comprise a second dopant concentration different from the first dopant concentration.

22 Claims, 2 Drawing Sheets

US 6,773,972 B2

MEMORY CELL WITH TRANSISTORS HAVING RELATIVELY HIGH THRESHOLD VOLTAGES IN RESPONSE TO SELECTIVE GATE DOPING

This application claims priority under 35 USC §119(e)(1) of provisional application No. 60/259,324 filed Jan. 3, 2001.

CROSS-REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present embodiments relate to transistor circuits and are preferably directed to a memory with storage cells having transistors with relatively high threshold voltages.

The technology of many modern circuit applications continues to advance at a rapid pace. One incredibly prolific type of circuit, and one which is highly developed, is digital memory. For such memories, consideration is given to all aspects of design, including maximizing efficiency and increasing performance. These considerations may be evaluated based on the integrated circuit device in which the memory is formed, where such devices may be implemented either as stand-alone products or as part of a larger circuit such as a microprocessor. One often critical factor with respect to digital memories is the cost of the device and this cost is often affected by the overall size of the memory architecture.

In response to the above considerations, recent interest has grown in the use of a so-called 4T memory cell, where this name suggests that each cell includes a total of four transistors. As detailed later in this document, two of the transistors in the 4T cell provide access to the state of the cell, that is, to either read data from or write data to, the cell. These transistors are referred to in this document as access transistors, although they may be referred to using various other terms in the art. The remaining two transistors in the cell are cross-coupled and maintain the state of the cell once it is written. These two transistors are referred to in this document as state transistors, although they too may be referred to using various other terms in the art. In any event, one of the reasons that the 4T cell has received favor is because it is smaller than other memory cells, such as a standard 6T (i.e., six transistor) memory cell. Additionally, the 4T cell reduces the standby current consumption in large area memory arrays as compared to more complex cell architectures.

While the 4T cell provides various benefits, a key consideration in its operation is that its two access transistors, which typically are p-channel metal oxide semiconductor (PMOS) transistors, must be designed to have a greater leakage current than its two state transistors, which typically are n-channel MOS transistors (i.e., NMOS). In the prior art, the reduced leakage in the state transistors is achieved by increasing the threshold voltage of those state transistors, thereby decreasing their leakage. However, the memory cells, and hence the state transistors, are typically part of a larger memory circuit that includes other NMOS circuits, such as in input/output devices or amplifiers also formed in connection with the memory circuit. Thus, while the threshold voltage of the n-channel state transistors may be increased to achieve desirable operation within a cell, the threshold voltage of other NMOS devices on the memory circuit typically must be left to a lower level so as to preserve the desired circuit operation (e.g., speed, current consumption) of those other NMOS devices. In other words, this prior art approach requires a dual or selective VT process with respect to the NMOS devices, whereby one threshold voltage is established for the NMOS state transistors while another threshold voltage is established for some or all of the other NMOS transistors on the same circuit chip.

To achieve the above-described dual threshold voltage structure, the prior art includes a technique where multiple masks and multiple doping steps are used to create different dopant concentrations in the channel region for the various NMOS transistors of the memory circuit. More particularly, a first mask step followed by a first doping step are used to establish a first dopant concentration in the channel region of a first set of NMOS transistors and thereby to cause those transistors to have a first threshold voltage, and a second mask step followed by a second doping step are used to establish a second dopant concentration in the channel region of a second set of NMOS transistors and thereby to cause those transistors to have a second threshold voltage which is different than the first threshold voltage. However, this approach requires two sets of masks and two implant steps with respect to the channel of the NMOS devices. Thus, it increases the processing complexity and thereby adds costs to the device. As such, these drawbacks negate some of the benefits of using 4T cells in the first place.

In view of the above, there arises a need to address the drawbacks of the prior art as is achieved by the preferred embodiments described below.

BRIEF SUMMARY OF THE INVENTION

In the preferred embodiment, there is a method of forming a semiconductor circuit. The method forms a first transistor using various steps, such as by forming a first source/drain region as a first doped region in a fixed relationship to a semiconductor substrate and forming a second source/drain region as a second doped region in a fixed relationship to the semiconductor substrate. The second doped region and the first doped region are of a same conductivity type. Additionally, the first transistor is formed by forming a first gate in a fixed relationship to the first source/drain region and the second drain region. The method also forms a second transistor using various steps, such as by forming a third source/drain region as a third doped region in a fixed relationship to the semiconductor substrate and forming a fourth source/drain region as a fourth doped region in a fixed relationship to the semiconductor substrate. The fourth doped region and the third doped region are of the same conductivity type as the first and second doped regions. Additionally, the second transistor is formed by forming a second gate in a fixed relationship to the third source/drain region and the fourth drain region. Also in the preferred embodiment method, the steps of forming the first gate and the second gate comprising forming the first gate to comprise a first dopant concentration and forming the second gate to comprise a second dopant concentration different from the first dopant concentration. Other methods, circuits, and systems are also disclosed and claimed.

DETAILED DESCRIPTION OF THE INVENTION

Figure 1A:
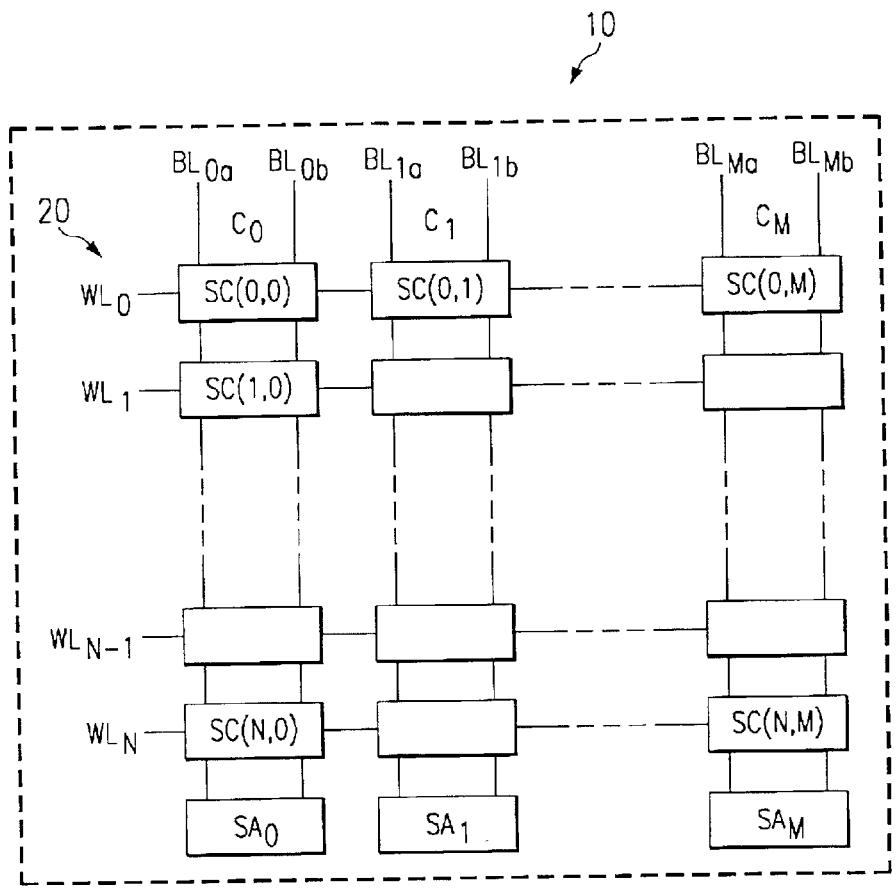
FIG. 1a illustrates an integrated circuit including a memory configuration formed in an array fashion and having a plurality of memory storage cells, where the general configuration is implemented in the prior art but is also improved upon by implementing it in connection with the preferred embodiments.

FIG. 1a illustrates an integrated circuit 10 including a memory configuration 20, where in general integrated circuit 10 is typical of that in the art and, thus, includes components formed using a semiconductor substrate and various layers formed above that substrate; however, the same integrated circuit 10 as shown in FIG. 1a also may implement the preferred teachings of this document and, in such an approach, various benefits are provided over the prior art. Looking in detail to FIG. 1a, it illustrates a memory configuration 20 generally in a combined block and schematic form. Memory configuration 20 is generally connected in an array form, thereby presenting a number of wordlines $WL_0$ through $WL_N$ each aligned in the x-dimension and a number of columns $C_0$ through $C_M$ each aligned in the y-dimension. At the intersection of each wordline and column is a storage cell abbreviated SC, and some of which are shown by way of example as having a coordinate (WL,C) such that the first element specifies the wordline corresponding to the storage cell and the second element specifies the column corresponding to the storage cell. For example, in the upper left corner of the array is a cell SC(0,0) corresponding to column $C_0$ and wordline $WL_0$, while in the lower right corner of the array is a cell SC(N,M) corresponding to column $C_M$ and wordline $WL_N$. The array nature of memory configuration 20 permits either writing data to, or reading data from, a storage cell on a wordline basis. In other words, one or more storage cells along the same wordline may be accessed (i.e., for either read or write) at a time.

Memory configuration 20 is representative of a static random access memory (SRAM) and, consequently, for each column a pair of conductors extends between storage cells along the column, where these conductors are referred to in the art as bitlines. The bitlines permit either reading or writing of a cell connected to a given pair of bitlines, as introduced generally here and as detailed further in connection with FIG. 1b, below. Turning first to an introduction of these operations, for purposes of writing data to the cell, one of the two bitlines is pulled down with some external write circuit (not shown), and then the wordline of the cell is asserted to write the data state to the cell in response to the pulled down bitline. For purposes of reading data from the cell, the two bitlines for a given cell provide two respective signals which are compared to one another to determine the data stored at a cell along a selected one of the wordlines. More specifically, the signals provided by each bitline pair in FIG. 1a are connected to corresponding sense amplifier circuits, shown as $SA_0$ through $SA_M$. For purposes of discussion, the subscript of each of the sense amplifier circuits matches that of the column to which it corresponds. Each of sense amplifier circuits $SA_0$ through $SA_M$ includes circuitry for "sensing" the differential voltage along the paired bitlines by amplifying it. Typically, the differential voltage is either amplified to a full scale signal or there may be stages which amplify the current drive to some level having a lesser signal swing then a full scale signal. This signal may then be used either by other circuitry, either internally on integrated circuit 10 or external from that device. Note also that FIG. 1a illustrates each sense amplifier circuit as connected only to a single pair of corresponding column conductors by way of example, whereas other variations may exist in the correlation between column conductors and sense amplifier circuits. In other words, as an alternative to that shown in FIG. 1a, an embodiment may be created where more than two bitlines are connected by some multiplexing functionality to a single sense amplifier circuit; thus, one pair of these bitlines may then be selected at a time to provide a differential signal to the sense amplifier circuit.

Figure 1B:
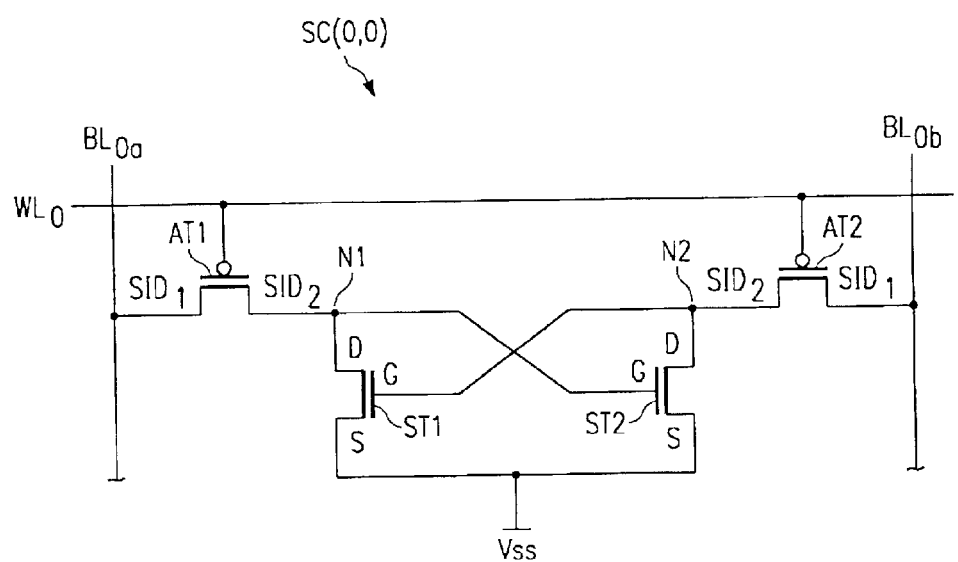
FIG. 1b illustrates a schematic of a 4T memory cell circuit which may be used for each of the storage cells in FIG. 1a, where the general schematic is implemented in the prior art but is also improved upon by implementing it in connection with the preferred embodiments.

FIG. 1b illustrates a schematic of prior art storage cell SC(0,0) in greater detail, with it understood that each of the remaining storage cells of FIG. 1a is constructed in the same manner (yet, of course, connected to a different one of either a wordline or pair of bitlines, or both). At the outset, note for further discussion that the bitlines from column 0 of FIG. 1a are designated in FIG. 1b with the abbreviation "$BL_0$", and are further distinguished from one another by adding one of the letters "a" and "b" to the subscripts for these conductors. Storage cell SC(0,0) is what is referred to in the art as a 4T cell, meaning it includes four transistors. For purposes of presenting a basis for a functional description below, each of these transistors is further referred to by combining the word "transistor" with a descriptive term relating to the function of the transistor. In this regard, storage cell SC(0,0) includes two access transistors AT1 and AT2, and two state transistors ST1 and ST2. The functional terms "access" and "state" are chosen to facilitate an understanding by one skilled in the art but not by way of limitation, as other terms are also sometimes used in the art for such transistors. For example, the access transistor are sometimes referred to as passgate transistors. In any event, from the additional details including the connection and function of each of these transistors as provided below, one skilled in the art will appreciate those transistors which are the subject of the present inventive embodiments, regardless of the particular terminology directed to such transistors.

Turning first to the two access transistors AT1 and AT2, both are p-channel transistors and are connected in a symmetric manner. Accordingly, the following discussion first addresses access transistor AT1 followed by a brief discussion of the similar nature of access transistor AT2. The gate of access transistor AT1 is connected to wordline $WL_0$. As a transistor, access transistor AT1 has two typically symmetric regions which are commonly characterized as source and drain regions. Specifically, often for a transistor, one of these regions is referred to as the source while the other is the drain, based on the relative potentials connected to those regions. However, in an implementation such as storage cell SC(0,0), the potential at either region may swing relative to the other and, thus, a given region may in one instance be considered the source while in another instance may be considered the drain. For this reason, from this point forward and also for the remaining comparable transistors discussed in this document each region is referred to as a source/drain. Given that convention, access transistor AT1 has two source/drains $S/D_1$ and $S/D_2$. Source/drain $S/D_1$ is connected to bitline $BL_{0a}$ and source/drain $S/D_2$ is connected to a node N1. Looking now to access transistor AT2, its gate is also connected to wordline $WL_0$. A first source/drain $S/D_1$ of access transistor AT2 is connected to bitline $BL_{0b}$, while a second source/drain $S/D_2$ of access transistor AT2 is connected to a node N2.

Looking now to state transistors ST1 and ST2, both are n-channel transistors and connected in a symmetric manner. Turning first to state transistor ST1, its source is connected to a relatively low voltage, which is shown as $V_{SS}$ as is customary in the transistor art and which typically is ground. The drain of state transistor ST1 is connected to node $N_1$. Lastly, the gate of state transistor ST1 is connected to node N2. Looking now to state transistor ST2, its source is connected to $V_{SS}$ and its drain is connected to node N2. The gate of state transistor SPT2 is connected to node N1.

In operation, a binary value may be either written to, or read from, storage cell SC(0,0). When power is first applied to storage cell SC(0,0), it will assume one of two binary states, with the state being understood as random at this initial point of operation. The cases of either a subsequent write of data to storage cell SC(0,0), or a read from storage cell SC(0,0), are discussed separately below.

A write to storage cell SC(0,0) is as follows. First, one of bitlines $BL_{0a}$ and $BL_{0b}$ is pulled low by some write circuit (not shown) while the other remains high. For an example, assume that bitline $BL_{0a}$ is pulled low and, thus, bitline $BL_{0b}$ remains high. Next, wordline $WL_0$ is asserted low which enables access transistors AT1 and AT2 by placing the low signal at the gates of those transistor. In this regard, note that the term "enable" is intended as known in the art to indicate that a sufficient source-to-gate potential is provided such that the transistor channel fully conducts. Additionally, although other storage cells are not shown in FIG. 1b, note that other cells which likewise have access transistor gates connected to wordline $WL_0$ are concurrently enabled for writing due to the enabling signal on wordline $WL_0$. Returning to storage cell SC(0,0), the enabling of access transistor AT2 connects the high potential on bitline $BL_{0b}$ to node N2 and, hence, to the gate of state transistor ST1, thereby enabling state transistor ST1 and pulling node N1 to ground. Moreover, at the same time, access transistor AT1 is enabled, and since bit line $BL_{0a}$ is low, then node N1 continues to be pulled down by enabled state transistor ST1. At the same time, the low potential at node N1 is applied to the gate of state transistor ST2, thereby maintaining it in a non-enabled (i.e., "disabled") state. As a result, the high potential at node N2 is not pulled downward and remains at node N2. Lastly, given the preceding operation and for reasons detailed later, the states at nodes N1 and N2 are maintained even after wordline $WL_0$ is no longer enabling to access transistors AT1 and AT2. Consequently, storage cell SC(0,0) will maintain the stored data state until it is thereafter changed by a subsequent write operation.

A read from storage cell SC(0,0) is as follows. At the outset, for the sake of the following example, assume that the following read occurs after the above-described write and, thus, node N1 is maintained low while node N2 is maintained high. Turning to the read operation, first both bitlines $BL_{0a}$ and $BL_{0b}$ are precharged high. Second, wordline $WL_0$ is enabled, once again enabling access transistors AT1 and AT2. Next, the low signal at node N1 is effectively transferred to $BL_{0a}$; more particularly, the combination of the enabled access transistor AT1 and the enabled state transistor ST1 pulls the precharged voltage of bitline $BL_{0a}$ low. At the same time, however, the precharged voltage at bitline $BL_{0b}$ is not disturbed. Consequently, sense amplifier $SA_0$ (see FIG. 1a) next amplifies the differential voltage between bitlines $BL_{0a}$ and $BL_{0b}$, thereby providing a voltage which based on the relative values between those bitlines represents a binary state for storage cell SC(0,0).

Having now described both the write and read operations with respect to storage cell SC(0,0), note that the ability for cell SC(0,0) to maintain a stored voltage once its access transistors are disabled is based on a requirement of the leakage current of the active transistors relative to the state transistors. More specifically, note that proper operation is obtained by the relative order of leakage current capability for the transistors in storage cell SC(0,0) as shown in the following Equation 1:

leakage current(AT)>leakage current(ST)   Equation 1

Equation 1 demonstrates that the leakage current capability of the access transistors is larger than the leakage current capability of the state transistors. This requirement may be appreciated further by way of an example. Suppose that a binary 0 is stored at node N1 and, hence, a binary 1 is stored at node N2; due to these values, state transistor ST1 is enabled while state transistor ST2 is disabled. Further, during a nonaccess period, both access transistors AT1 and AT2 are disabled. Since state transistor ST2 is disabled, it will leak a certain amount of current, thereby tending to pull the binary 1 at node N2 downward; however, to maintain the state of cell SC(0,0), node N2 cannot be being pulled down too much or else the state of the cell may become unstable, or even flip states. Accordingly, because access transistor AT2 is designed to leak more than state transistor ST2, then any leakage of state transistor ST2 causing node N2 to pull down is compensated by permitting access transistor AT2 to leak to a greater extent (from precharged bit line $BL_{0b}$), thereby maintaining node N2 at the appropriate binary 1 level. In an opposite state, these same concepts apply to access transistor AT1 and state transistor ST1.

Given the requirement of relative current leakage as between the access and state transistors of cell SC(0,0), one approach toward achieving this requirement is to increase the threshold voltage of the NMOS state transistors. In the prior art, an increased threshold voltage is achieved by providing an additional implant into the channel region of a MOS transistor and, thus, such an approach may be implemented in cell SC(0,0). However, it is very likely that the NMOS state transistors will be on a chip having other NMOS transistors that should not have an increased threshold voltage. As a result, a dual or split threshold voltage process is required in the prior art, that is, certain NMOS transistors on the chip require a first mask and a first channel implant to achieve a first threshold voltage, while other NMOS transistors on the chip require a second mask and a second channel implant to achieve a second threshold voltage. The present inventors recognize that such an approach requires dual masking and implanting steps, and thereby increases the cost and complexity of the manufacturing process. At a time when market demands and competition are considerable, such added burdens are highly undesirable. Accordingly, the preferred embodiments seek to reduce these burdens while achieving the relative current leakage requirements set forth in Equation 1 above.

Figure 2A:
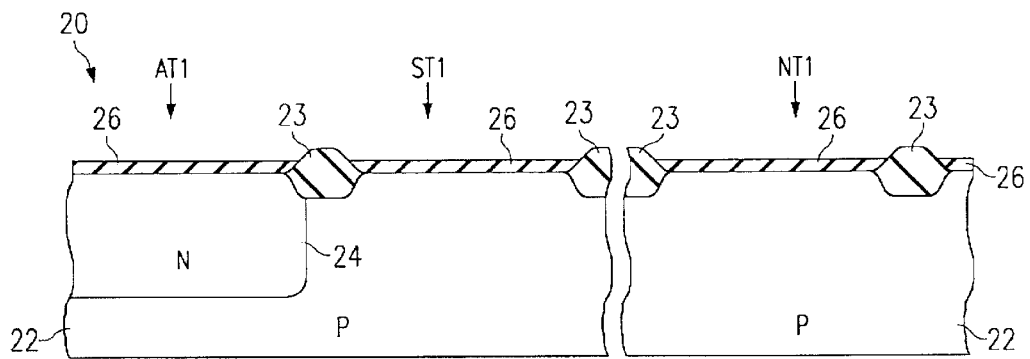
FIG. 2a illustrates a cross-sectional view of a portion of the preferred embodiment for a memory configuration.

FIG. 2a illustrates a cross-sectional view of a portion of the preferred embodiment for memory configuration 20, where as further appreciated below FIG. 2a illustrates three transistors formed in configuration 20. More particularly, FIG. 2a as well as FIGS. 2b through 2c below illustrate the fabrication of access transistor AT1 and state transistor ST1 from cell SC(0,0), and they further illustrate an additional n-channel transistor NT1 which is constructed elsewhere within configuration 20, such as in sense amplifier $SA_0$. Generally, only three such transistors are shown to simplify the illustration and discussion while also demonstrating the benefits of the preferred embodiment, where one skilled in the art should readily appreciate how the illustration as to these three transistors applies likewise to other transistors in other cells of configuration 20 as well as to other n-channel transistors formed outside of those cells. Further in this regard, note as the following discussion continues that both state transistor ST1 and transistor NT1 are n-channel transistors, but for the reasons discussed above it is preferred that state transistor ST1 has a higher threshold voltage (and lower current leakage) than transistor NT1.

Looking in detail to FIG. 2a, all three transistors are formed in relation to a p-type substrate 22 which, due to its conductivity type, is labeled generally with a P designation. Generally, isolation regions 23 are formed at the surface of substrate 22, and which may be field oxide or shallow trench isolation regions by ways of example. In any case, transistors AT1, ST1, and NT1 are each formed between a pair of isolation regions 23. An n-type well 24 is formed in p-type substrate 22, and due to its conductivity type well 24 is labeled generally with an N designation. N-type well 24 is preferably formed by masking the upper surface of substrate 22 and then implanting an appropriate n-type dopant, such as phosphorous or arsenic, into that upper surface. In addition, a subsequent diffusion step may be performed after the implant, such as by way of a heating (e.g., annealing) process. Finally, a gate dielectric 26 is formed over substrate 22

Figure 2B:
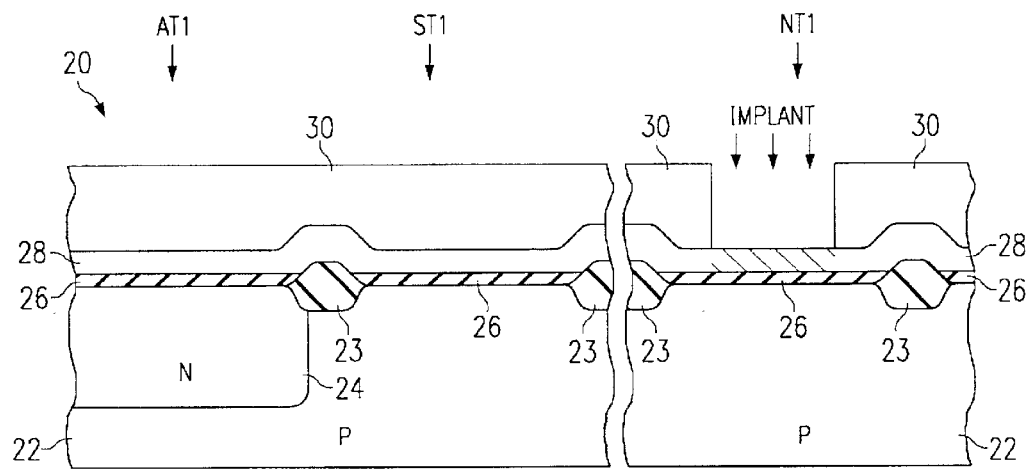
FIG. 2b illustrates the cross-sectional view of configuration 20 from FIG. 2a after additional processing steps.

FIG. 2b illustrates the cross-sectional view of configuration 20 from FIG. 2a after additional processing steps. Specifically, in FIG. 2b, a gate conductor layer 28 is formed over gate dielectric 26 and isolation regions 23. In the preferred embodiment, gate conductor layer 28 is formed from polysilicon. Preferably, the polysilicon used for conductor layer 28 may be formed in situ with a p-type doping and, indeed, it may be a relatively large p-type concentration; in an alternative embodiment, however, the polysilicon used for conductor layer 28 may be formed with a different or no doping.

After gate conductor layer 28 is formed, a photoresist layer 30 is formed over gate conductor layer 28, and photoresist layer 30 is then patterned and etched so that selected areas of gate conductor layer 28 are exposed. In the preferred embodiment, and for reasons further appreciated below, photoresist layer 30 is removed in the area in which lower threshold voltage n-channel transistors are formed (e.g., NT1). However, photoresist layer 30 is left intact in two other areas: (1) the areas where p-channel transistors are formed (e.g., access transistor AT1); and (2) the areas where higher threshold voltage NMOS transistors are formed (e.g., state transistor ST1).

After photoresist layer 30 is patterned and etched, an n-type ion implant is performed such that the exposed area of gate conductor layer 28 receives n-type doping. In the example of FIG. 2b, therefore, gate conductor layer 28 in the area of transistor NT1 receives the n-type doping. As a result, in the preferred embodiment where gate conductor layer 28 is formed in situ as a p-type semiconductor layer, then the n-type dopants counterdope the exposed areas. For the sake of illustration, the single doped area in layer 28 is shaded in FIG. 2b. In contrast, the areas of gate conductor layer 28 relating to p-channel transistors and high threshold voltage transistors (e.g., AT1, ST1, respectively) do not receive the n-type doping in their respective gate areas and, thus, these areas are not shaded in FIG. 2b.

From the preceding, an additional observation is noteworthy with respect to the implant step illustrated in FIG. 2b. Specifically, it is known in the MOS art to perform a blanket doping step of the gate conductor for all like conductivity type transistors, such as an n-type doping step for all n-channel transistors. For example, such an approach is often taken to reduce the resistance of the gates of those transistors to improve the gate inversion capacitance of those transistors, thereby increasing the operational speed of those same transistors. Thus, such a step is typically already included in the process flow for constructing a memory configuration such as configuration 20. However, the present inventors have determined that the increased device speed may not be critical or even necessary in certain circuit applications, and indeed in the preferred embodiment one of these very areas is that of the n-channel state transistors. Specifically, the overall operational speed of configuration 20 may be limited by other circuit elements, such as by its sense amplifiers $SA_0$ through $SA_M$. As another consideration, often 4T cells are used in memory configurations that operate at relatively lower speeds and, thus, there may be a reduced need for the additional speed, if any, which would be achieved by doping the gates of the n-channel state transistors. In any event, FIG. 2b illustrates that in the preferred embodiment there is only selective gate doping of certain n-channel transistors (e.g., NT1), and indeed those transistors are preferably the ones where speed is of a greater concern; hence, it is for this reason that it is stated above that transistor NT1 as an example may be considered to be part of one of sense amplifiers $SA_0$ through $SA_M$.

Figure 2C:
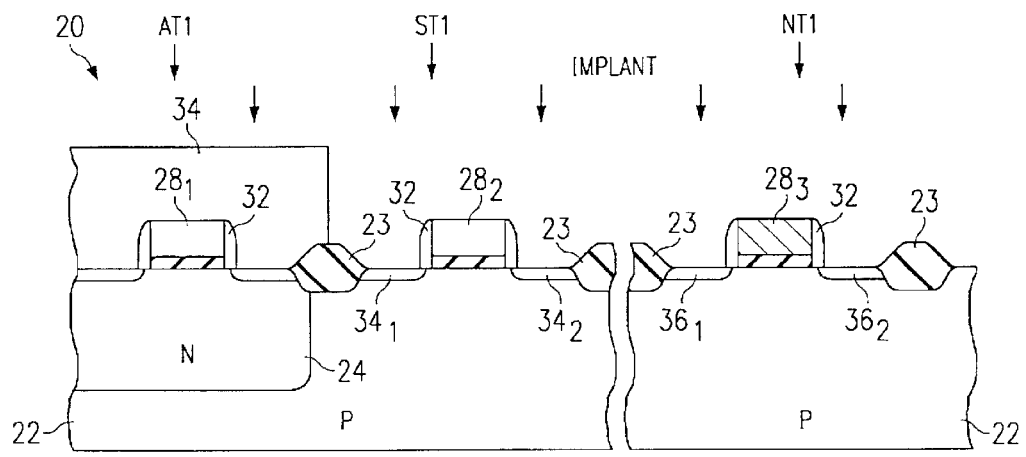
FIG. 2c illustrates the cross-sectional view of configuration 20 from FIG. 2b after additional processing steps.

FIG. 2c illustrates a cross-sectional view of configuration 20 from FIG. 2b after additional processing steps. Specifically, in FIG. 2c, photoresist 30 from FIG. 2b has been removed, and a new pattern has been used to form the gate conductors $28_1$, $28_2$, and $28_3$ for access transistor AT1, state transistor ST1, and n-channel transistor NT1, respectively. From the preceding discussion as well as the shading in FIG. 2c, one skilled in the art will appreciate that gates conductors $28_1$ and $28_2$ have the doping of gate conductor layer 28 when it was formed (e.g., p-type in situ), while, gate conductor $28_3$ is doped with n-type dopants implanted in a step illustrated in FIG. 2b.

Also in FIG. 2c, sidewall insulators 32 are formed at each gate sidewall, such as by forming an oxide layer and etching it appropriately. Next, a photoresist layer 34 is formed and patterned and etched so as to protect the components of the p-channel access transistor AT1, thereby leaving the n-channel transistors ST1 and NT1 exposed. Finally, an n-type dopant implant is performed, thereby forming n-type source/drain regions $34_1$ and $34_2$ for state transistor ST1 and n-type source/drain regions $36_1$ and $36_2$ for n-channel transistor NT1. Note further that the n-type dopant implant use to form these n-type source/drain regions also will further implant dopants into gate conductors $28_2$ and $28_3$, unless these gate conductors are masked from those implants. Even in the instance that no masking occurs and thus gate conductors $28_2$ and $28_3$ receive these implants, the result following FIG. 2c will still cause transistor NT1 to have a greater dopant concentration in its gate as compared to that of transistor ST1 due to the previous masking and doping steps illustrated in connection with FIG. 2b.

While not shown in FIG. 2c or otherwise, one skilled in the art will appreciate at least two other aspects. First, various additional layers and connections may be made relative to the devices therein. For example, following the illustration of FIG. 2c, the n-channel transistors are masked and a p-type implant is made with respect to access transistor AT1 to form its source/drain regions. As another example, additional metal layers may be formed so as to provide appropriate electrical connects, such as to connect the drain of state transistor ST1 to a source/drain of access transistor AT1, thereby providing node N1 as shown in FIG. 1b. Second, substrate 22 will support numerous other devices including the other cells and devices of memory configuration 20, and possibly still others. In any event, any such other devices may include the formation of regions using comparable doping implants steps and masks as used for transistors AT1, ST1, and NT1.

Having described the preferred embodiment, one skilled in the art will appreciate that following the steps illustrated in FIG. 2c, a memory configuration will be provided having n-channel transistors with differing threshold voltages. In the preferred embodiment, the difference in threshold voltage is achieved by creating n-channel transistors having a different level of dopants in their respective gate conductors. Further in the preferred embodiment, this structure is achieved at no additional cost versus a previous high frequency device because such a device commonly used a mask and implant step to implant n-type dopants into the gates of all of the n-channel devices of the circuit, whereas the preferred embodiment modifies the mask to also prevent such dopants from reaching selected n-channel transistor gates. After the n-type dopants are applied to this selective mask, the resulting structure includes a first set of n-channel transistors having a greater level of n-type dopants in their gates as opposed to a second set of n-channel transistors having a different level of n-type dopants in their gates. In the example set forth above, the first set includes n-channel transistor NT1, while the second set includes n-channel state transistor ST1 (and preferably all other state transistors in all other cells of the memory configuration). As a result of limiting the amount of n-type dopants in the gate of the transistors of the second set, when a gate voltage is applied to the gate of a transistor in that set, there is a relatively greater amount of depletion in the gate as compared to the gates in the first set of transistors (with the larger doping). This larger depletion therefore increases the threshold voltage of the lesser-doped second set of n-channel transistors as compared to the threshold voltage of the higher-doped first set of n-channel transistors. In the context of memory configuration 20, the greater threshold voltage transistors are implemented as state transistors, thereby improving the compliance with Equation 1 and, hence, improving each cell's ability to properly maintain a stored voltage state.

From the above, it may be appreciated that the preferred embodiments provide a method for forming and a resulting structure with like conductivity type transistors with different threshold voltages, where the difference is achieved by providing a different level of doping in the gate conductors of the different transistors. Further, the varying dopant levels are preferably achieved by selectively masking one set of those transistors from a gate implant step which thereby dopes the gates of other like-conductivity type transistors that are not masked during that step. Still further, the preferred embodiments are particularly beneficial in the context of a 4T SRAM memory, whereby the higher threshold voltage transistors may be used as state transistors in the cells of the SRAM memory, thereby decreasing the current leakage of those transistors so as to improve the reliability of the state maintenance of those cells while achieving other benefits that are associated with a 4T cell (e.g., size and cost reduction). Moreover, while the present embodiments have been described in detail, various substitutions, modifications or alterations could be made to the descriptions set forth above without departing from the inventive scope. For example, while the preferred embodiment has been shown implemented in a 4T cell, one skilled in the art may find other circuits in which a variance in threshold voltage may be desired for like conductivity type transistors and where the present teachings may otherwise provide one or more benefits. As another example, while the preferred embodiment has been illustrated in the context of varying threshold voltages as between different n-type transistors, the general method flow may be applied to p-type transistors by one skilled in the art. Finally, one skilled in the art may ascertain other examples. Thus, the preceding teachings as well as these examples further illustrate the inventive scope, which is defined by the following claims.

What is claimed is:

1. A method of forming a semiconductor circuit, comprising the steps of:

forming a first transistor, comprising the steps of:
  forming a first source/drain region as a first doped region in a fixed relationship to a semiconductor substrate;
  forming a second source/drain region as a second doped region in a fixed relationship to the semiconductor substrate, wherein the second doped region and the first doped region are of a same conductivity type; and
  forming a first gate in a fixed relationship to the first source/drain region and the second drain region; and forming a second transistor, comprising the steps of:
  forming a third source/drain region as a third doped region in a fixed relationship to the semiconductor substrate;
  forming a fourth source/drain region as a fourth doped region in a fixed relationship to the semiconductor substrate, wherein the fourth doped region and the third doped region are of the same conductivity type as the first and second doped regions;
  forming a second gate in a fixed relationship to the third source/drain region and the fourth drain region; and wherein the steps of forming the first gate and the second gate comprise forming the first gate to comprise a first dopant concentration and forming the second gate to comprise a second dopant concentration different from the first dopant concentration.

2. The method of claim 1 wherein the steps of forming the first and the second gate further comprise:

forming a semiconductor layer in a fixed relationship to the semiconductor substrate;

in an implant step, selectively implanting dopants into a portion of the semiconductor layer in an area corresponding to the first transistor while not implanting dopants into a portion of the semiconductor layer in an area corresponding to the second transistor.

3. The method of claim 2 wherein the steps of forming the first gate and the second gate further comprise patterning and etching the semiconductor layer to form the first gate from the area corresponding to the first transistor and the second gate from the area corresponding to the second transistor.

4. The method of claim 2 wherein the semiconductor layer comprises polysilicon.

5. The method of claim 4 wherein the step of forming a semiconductor layer comprises forming a polysilicon layer with an in-situ doping.

6. The method of claim 5:
wherein the in-situ doping comprises p-type in-situ doping; and
wherein the first, second, third, and fourth doped regions comprise n-type doped regions.

7. The method of claim 2:
wherein the first transistor has a first threshold voltage in response to the first dopant concentration; and
wherein the second transistor has a second threshold voltage in response to the second dopant concentration and such that the second threshold voltage is greater than the first threshold voltage.

8. The method of claim 7 wherein the second transistor comprises a state transistor in a memory cell.

9. The method of claim 8:
wherein the state transistor comprises a first state transistor;
and further comprising the step of forming a second state transistor in the memory cell, comprising the step of forming a third gate corresponding to the second state transistor and comprising the second dopant concentration.

10. The method of claim 9 and further comprising the steps of:
forming a first access transistor in the memory cell, the first access transistor coupled and operable to read a state from, and write a state to, a source/drain of the first state transistor; and
forming a second access transistor in the memory cell, the second access transistor coupled and operable to read a state from, and write a state to, a source/drain of the second state transistor.

11. The method of claim 10 wherein the first and second access transistors comprise source/drain regions of a conductivity type that is complementary of source/drain regions of the first and second state transistors.

12. The method of claim 11 wherein the first, second, third, and fourth doped regions comprise n-type doped regions.

13. The method of claim 12:
wherein the semiconductor layer comprises polysilicon; and
wherein the step of forming a semiconductor layer comprises forming a polysilicon layer with an in-situ doping.

14. The method of claim 12 wherein the first transistor comprises a transistor in a sense amplifier.

15. The method of claim 8 wherein the first transistor comprises a transistor in a sense amplifier.

16. The method of claim 15 wherein the first, second, third, and fourth doped regions comprise n-type doped regions.

17. A method of forming a memory configuration, comprising the steps of:
forming a plurality of memory cells, wherein each of the memory cells is formed comprising the step steps of:
forming a first transistor, comprising the steps of:
forming a first source/drain region as a first doped region in a fixed relationship to a semiconductor substrate;
forming a second source/drain region as a second doped region in a fixed relationship to the semiconductor substrate, wherein the second doped region and the first doped region are of a same conductivity type; and
forming a first gate in a fixed relationship to the first source/drain region and the second drain region; and
forming a second transistor outside of the plurality of memory cells, comprising the steps of:
forming a third source/drain region as a third doped region in a fixed relationship to the semiconductor substrate;
forming a fourth source/drain region as a fourth doped region in a fixed relationship to the semiconductor substrate, wherein the fourth doped region and the third doped region are of the same conductivity type as the first and second doped regions;
forming a second gate in a fixed relationship to the third source/drain region and the fourth drain region; and
wherein, the step of forming the first gate for each cell in the plurality of memory cells and the step of forming the second gate further comprise:
forming a semiconductor layer in a fixed relationship to the semiconductor substrate; and
in an implant step, selectively implanting dopants into a portion of the semiconductor layer in an area corresponding to the second transistor such that the area has a first dopant concentration while not implanting dopants into a portion of the semiconductor layer in an area corresponding to the first transistor in each cell.

18. The method of claim 17:
wherein, for each cell, the first transistor has a first threshold voltage in response to the implant step; and
wherein the second transistor has a second threshold voltage in response to the first dopant concentration and such that the second threshold voltage is less than the first threshold voltage.

19. The method of claim 18:
wherein the first transistor comprises a first state transistor;
and further comprising the step of forming a second state transistor in the memory cell, comprising the step of forming a third gate corresponding to the second state transistor and wherein the implant step further comprises selectively implanting dopants into a portion of the semiconductor layer while not implanting dopants Into a portion of the semiconductor layer in an area corresponding to the second state transistor In each cell.

20. The method of claim 19 and further comprising the steps of:
forming a first access transistor in the memory cell, the first access transistor coupled and operable to read a state from, and write a state to, a source/drain of the first state transistor; and
forming a second access transistor in the memory cell, the second access transistor coupled and operable to read a state from, and write a state to, a source/drain of the second state transistor.

21. A semiconductor circuit, comprising:
a first transistor, comprising:
a first source/drain region comprising a first doped region in a fixed relationship to a semiconductor substrate;
a second source/drain region comprising a second doped region in a fixed relationship to the semiconductor substrate, wherein the second doped region and the first doped region are of a same conductivity type; and a first gate in a fixed relationship to the first source/drain region and the second drain region; and a second transistor, comprising:
- a third source/drain region comprising a third doped region in a fixed relationship to the semiconductor substrate;
- fourth source/drain region comprising a fourth doped region in a fixed relationship to the semiconductor substrate, wherein the fourth doped region and the third doped region are of the same conductivity type as the first and second doped regions;
- a second gate in a fixed relationship to the third source/drain region and the fourth drain region; and wherein the first gate comprises a first dopant concentration and the second gate comprises a second dopant concentration different from the first dopant concentration.

22. A memory configuration comprising:

a plurality of memory cells, wherein each of the memory cells comprises:
- a first transistor, comprising:
  - a first source/drain region comprising a first doped region in a fixed relationship to a semiconductor substrate;
  - a second source/drain region comprising a second doped region in a fixed relationship to the semiconductor substrate, wherein the second doped region and the first doped region are of a same conductivity type; and
  - a first gate in a fixed relationship to the first source/drain region and the second drain region; and the memory configuration further comprising a second transistor outside of the plurality of memory cells, comprising:
- a third source/drain region comprising a third doped region in a fixed relationship to the semiconductor substrate;
- a fourth source/drain region comprising a fourth doped region in a fixed relationship to the semiconductor substrate, wherein the fourth doped region and the third doped region are of the same conductivity type as the first and second doped regions;
- a second gate in a fixed relationship to the third source/drain region and the fourth drain region; and wherein the first gate for each cell in the plurality of memory cells comprises a first dopant concentration that is less than a dopant concentration in the second gate.

* * * * *